United States Patent
Peterson et al.

(10) Patent No.: US 10,035,224 B2
(45) Date of Patent: Jul. 31, 2018

(54) SYSTEMS AND METHODS FOR COOLING AN INFORMATION HANDLING SYSTEM AND COMPONENTS THEREOF

(75) Inventors: Chris E. Peterson, Austin, TX (US); Robert Curtis, Georgetown, TX (US)

(73) Assignee: Dell Products L.P., Round Rock, TX (US)

(*) Notice: Subject to any disclaimer, the term of this patent is extended or adjusted under 35 U.S.C. 154(b) by 1728 days.

(21) Appl. No.: 13/527,087

(22) Filed: Jun. 19, 2012

(65) Prior Publication Data

US 2013/0337735 A1 Dec. 19, 2013

(51) Int. Cl.
| H05K 7/20 | (2006.01) |
| B23P 11/00 | (2006.01) |
| F04D 17/00 | (2006.01) |
| F04D 29/58 | (2006.01) |
| F04D 29/60 | (2006.01) |

(52) U.S. Cl.
CPC ............ B23P 11/00 (2013.01); F04D 17/00 (2013.01); F04D 29/582 (2013.01); F04D 29/601 (2013.01); H05K 7/20727 (2013.01); Y10T 29/49826 (2015.01)

(58) Field of Classification Search
CPC ..................................................... H05K 7/20
USPC ....................................................... 454/184
See application file for complete search history.

(56) References Cited

U.S. PATENT DOCUMENTS

| 4,823,349 | A   |   | 4/1989  | Koop et al. ................. 372/34 |
| 5,410,448 | A   | * | 4/1995  | Barker et al. ............... 361/695 |
| 6,108,203 | A   | * | 8/2000  | Dittus et al. ................ 361/695 |
| 6,325,835 | B1  |   | 12/2001 | Shanks et al. ................. 55/467 |
| 6,437,980 | B1  |   | 8/2002  | Casebolt ..................... 361/687 |
| 6,556,438 | B1  |   | 4/2003  | Bolognia et al. ........... 361/687 |
| 6,592,449 | B2  | * | 7/2003  | Cipolla ..................... G06F 9/52 236/49.1 |
| 6,688,965 | B1  |   | 2/2004  | Crippen et al. ............. 454/184 |
| 6,878,874 | B2  | * | 4/2005  | Osborn ............. H05K 7/20736 174/17 VA |
| 6,991,533 | B2  | * | 1/2006  | Tsai et al. .................. 454/184 |
| 7,251,135 | B2  | * | 7/2007  | Crippen ............ H05K 7/20172 165/104.33 |
| 7,969,175 | B2  |   | 6/2011  | Hendrickson et al. .. 324/762.06 |
| 8,007,228 | B2  | * | 8/2011  | Wang .......................... 415/146 |
| 8,142,140 | B2  | * | 3/2012  | Warizaya .................... 415/146 |
| 8,720,532 | B2  | * | 5/2014  | Malone et al. .............. 165/121 |
| 9,157,536 | B2  | * | 10/2015 | Li |

(Continued)

*Primary Examiner* — Steven B McAllister
*Assistant Examiner* — Samantha Miller
(74) *Attorney, Agent, or Firm* — Jackson Walker L.L.P.

(57) ABSTRACT

In accordance with embodiments of the present disclosure, a blower module assembly may include a housing, a blower mechanically coupled to the housing, and an airflow guide mechanically coupled between the housing and the blower. The blower may be mechanically coupled to the housing, may have an intake and an exhaust, and may be configured to move air from the intake to the exhaust. The airflow guide may be mechanically coupled between the housing and the blower, may have a solid region and a plenum region such that the border between the solid region and the plenum region is defined by a portion of an arcuate cylinder. The housing, the blower, and the airflow guide may be arranged such that a plenum is defined by surfaces of the housing, the blower, and the portion of the arcuate cylinder, the plenum adjacent to the intake.

20 Claims, 5 Drawing Sheets

(56) References Cited

U.S. PATENT DOCUMENTS

| | | | |
|---|---|---|---|
| 2005/0088818 A1* | 4/2005 | Chou | 361/695 |
| 2008/0112127 A1 | 5/2008 | June et al. | 361/687 |
| 2008/0310103 A1* | 12/2008 | Della Fiora et al. | 361/690 |
| 2009/0215380 A1* | 8/2009 | Lin | 454/184 |
| 2013/0072103 A1* | 3/2013 | Hopkins et al. | 454/259 |

* cited by examiner

SYSTEMS AND METHODS FOR COOLING AN INFORMATION HANDLING SYSTEM AND COMPONENTS THEREOF

TECHNICAL FIELD

The present disclosure relates in general to information handling systems, and more particularly cooling an information handling system and components thereof.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM) and other components in information handling systems have increased in clock speed and power consumption, the amount of heat produced by such components as a side-effect of normal operation has also increased. Often, the temperatures of these components need to be kept within a reasonable range to prevent overheating, instability, malfunction and damage leading to a shortened component lifespan. Accordingly, cooling fans and blowers have often been used in information handling systems to cool information handling systems and their components.

Among the disadvantages associated with traditional fans and blowers are the acoustical noise generated by such devices. In many cases, high rotational speed and/or torque of fans or blowers may be needed to deliver the airflow required to effectively cool components and overcome airflow impedance. Such high rotational speeds increase sound power levels and tone amplitudes, potentially causing undesirable acoustical noise.

SUMMARY

In accordance with the teachings of the present disclosure, the disadvantages and problems associated with cooling an information system and components thereof may be substantially reduced or eliminated.

In accordance with embodiments of the present disclosure, a blower module assembly may include a housing, a blower mechanically coupled to the housing, and an airflow guide mechanically coupled between the housing and the blower. The blower may be mechanically coupled to the housing, may have an intake and an exhaust, and may be configured to move air from the intake to the exhaust. The airflow guide may be mechanically coupled between the housing and the blower, may have a solid region and a plenum region such that the border between the solid region and the plenum region is defined by a portion of an arcuate cylinder. The housing, the blower, and the airflow guide may be arranged such that a plenum is defined by surfaces of the housing, the blower, and the portion of the arcuate cylinder, the plenum adjacent to the intake.

In accordance with these and other embodiments of the present disclosure, an information handling system may include a chassis and a blower module assembly configured to be mechanically coupled to the chassis. The blower module assembly may include a housing, a blower mechanically coupled to the housing, and an airflow guide mechanically coupled between the housing and the blower. The blower may be mechanically coupled to the housing, may have an intake and an exhaust, and may be configured to move air from the intake to the exhaust. The airflow guide may be mechanically coupled between the housing and the blower, may have a solid region and a plenum region such that the border between the solid region and the plenum region is defined by a portion of an arcuate cylinder. The housing, the blower, and the airflow guide may be arranged such that a plenum is defined by surfaces of the housing, the blower, and the portion of the arcuate cylinder, the plenum adjacent to the intake.

In accordance with these and other embodiments of the present disclosure, a method may include mechanically coupling a blower to a housing, the blower having an intake and an exhaust, the blower configured to move air from the intake to the exhaust. The method may also include mechanically coupling an airflow guide between the housing and the blower, the airflow guide having a solid region and a plenum region such that the border between the solid region and the plenum region is defined by a portion of an arcuate cylinder. The method may further include arranging the housing, the blower, and the airflow guide are arranged such that a plenum is defined by surfaces of the housing, the blower, and the portion of the arcuate cylinder, the plenum adjacent to the intake.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
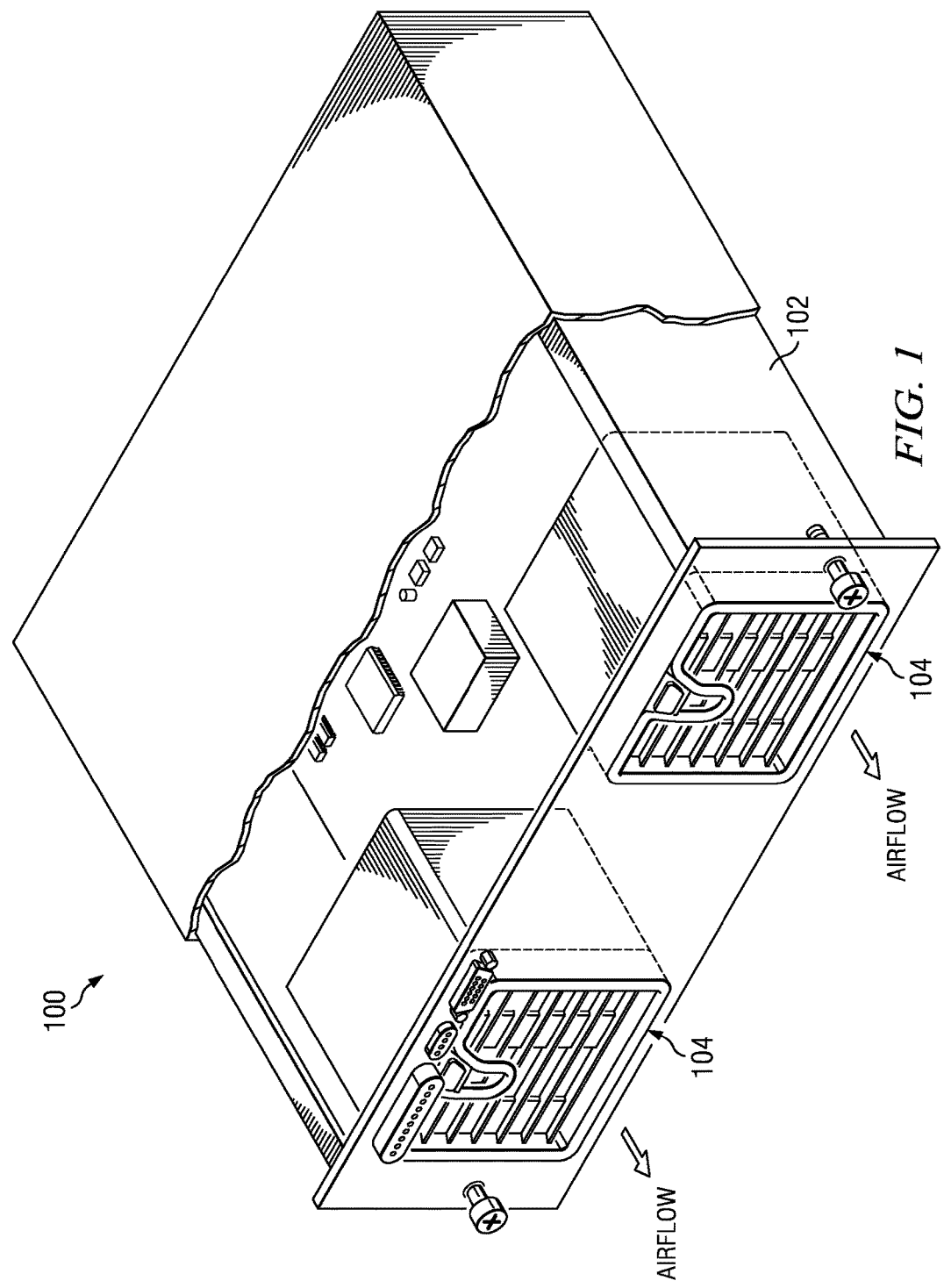
FIG. 1 illustrates a block diagram of an example information handling system having one or more blower module assemblies for cooling information handling resources, in accordance with the present disclosure.
Figure 2A:
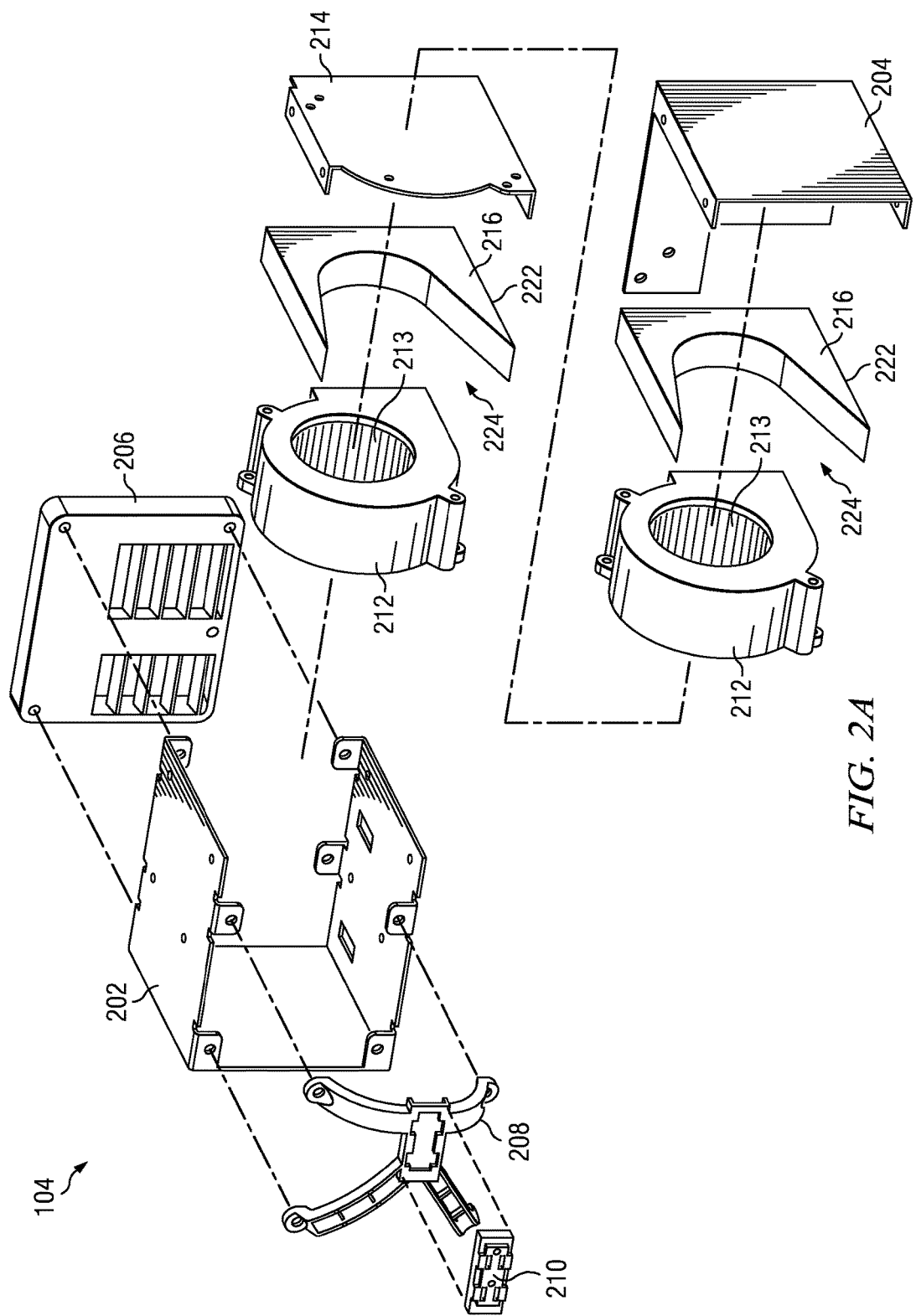
FIGS. 2A-2E illustrate various schematic views of an example blower module assembly, in accordance with the present disclosure.
Figure 2B:
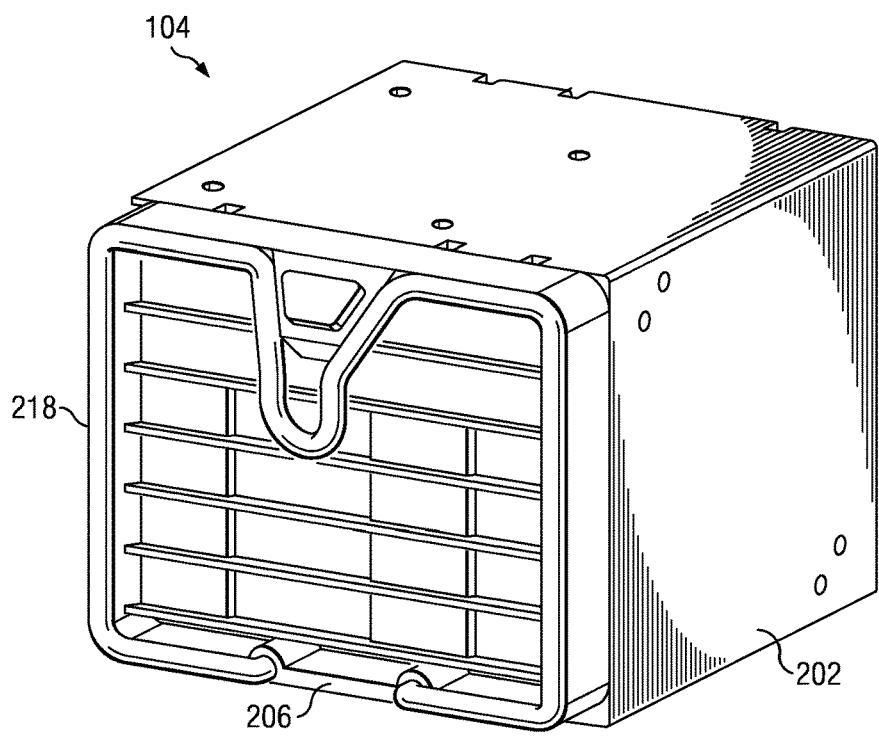
Figure 2C:
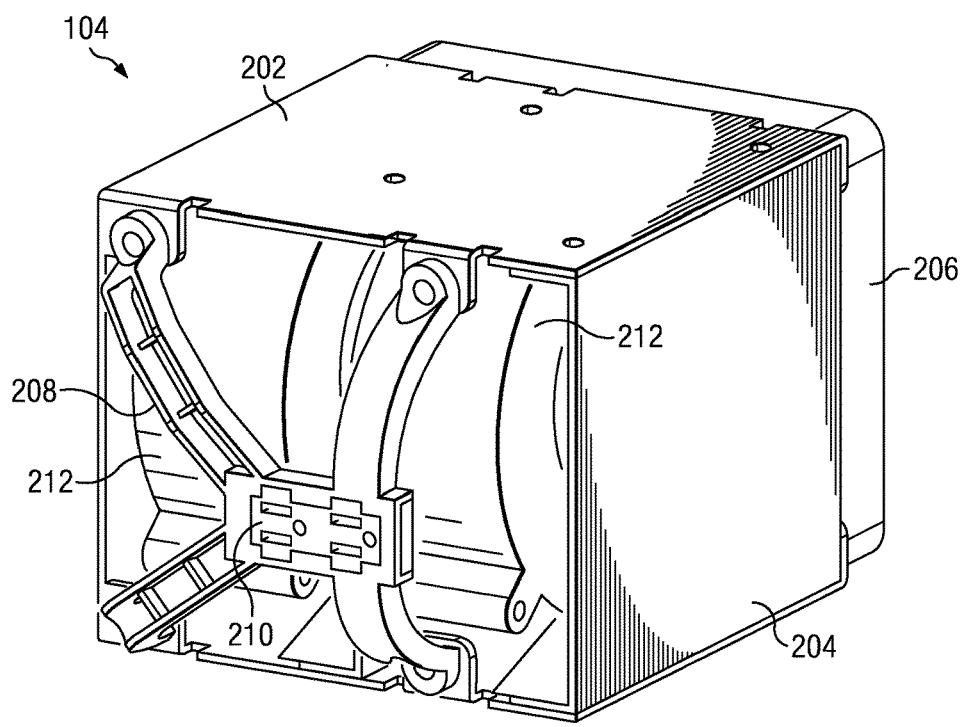
Figure 2D:
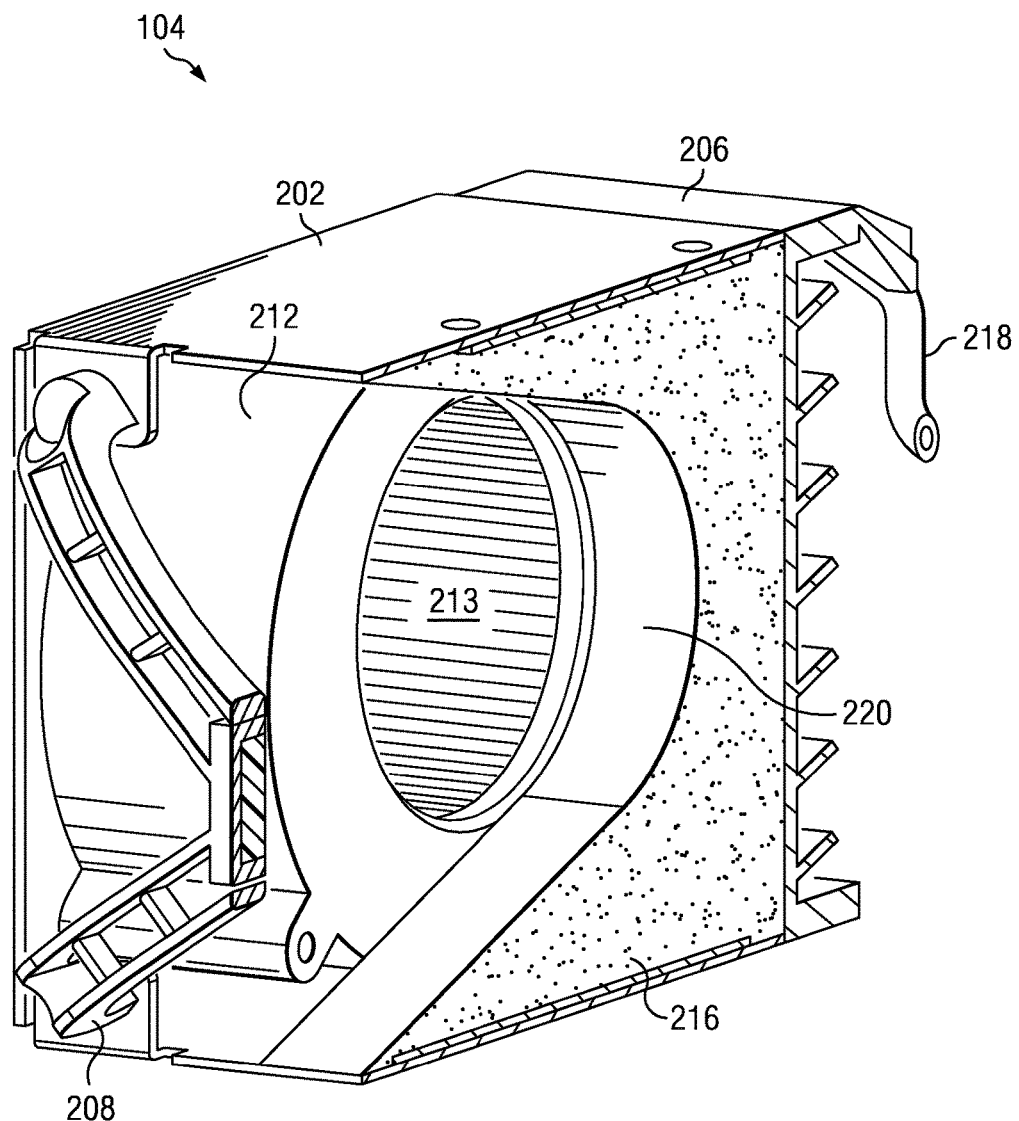
Figure 2E:
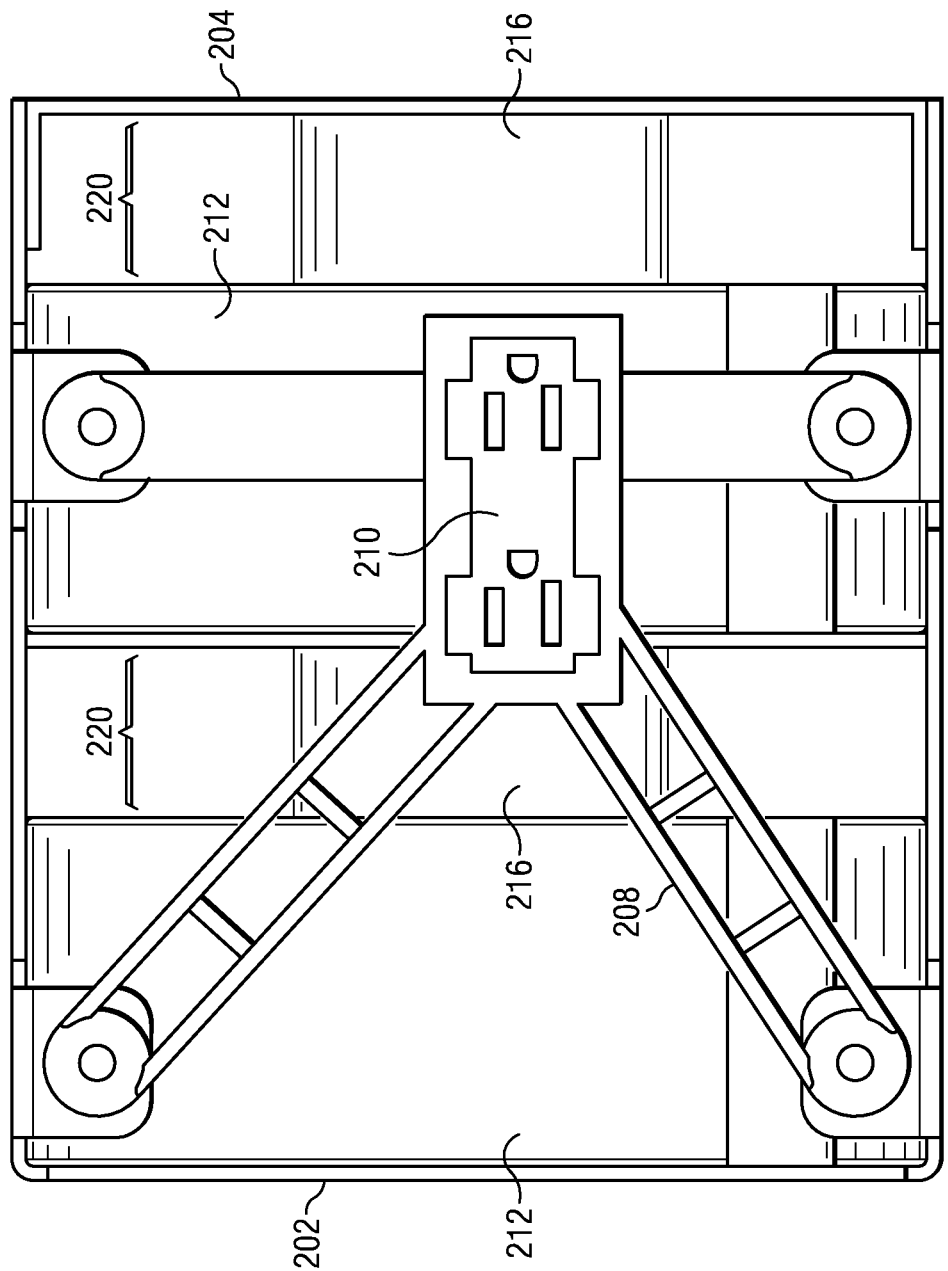

Preferred embodiments and their advantages are best understood by reference to FIGS. 1-2E, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components or the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, information handling resources may broadly refer to any component system, device or apparatus of an information handling system, including without limitation processors, busses, memories, input-output devices and/or interfaces, storage resources, network interfaces, motherboards, integrated circuit packages; electro-mechanical devices (e.g., fans), displays, and power supplies.

FIG. 1 illustrates a block diagram of an example information handling system 100 having one or more blower module assemblies 104 for cooling information handling resources of information handling system 100, in accordance with the present disclosure. In some embodiments, an information handling system 100 may comprise a server chassis configured to house a plurality or servers or "blades." In other embodiments, information handling system 100 may comprise a personal computer (e.g., a desktop computer, laptop computer, mobile computer, and/or notebook computer). In yet other embodiments, information handling system 100 may comprise a storage enclosure configured to house of plurality of physical disk drives and/or other computer-readable media for storing data.

As depicted in FIG. 1, information handling system 100 may include a chassis 102 having a plurality of blower module assemblies 104. Chassis 102 may be an enclosure that serves as a container for various information handling resources of information handling system 100, and may be constructed from steel, aluminum, plastic, and/or any other suitable material. Although the term "chassis" is used, chassis 102 may also be referred to as a case, cabinet, tower, box, enclosure, and/or housing.

Each of blower module assemblies 104 may be any mechanical or electro-mechanical system, apparatus, or device operable to move air and/or other gasses. In certain embodiments, blower module assemblies 104 may draw cool air into chassis 102 from the outside, expel warm air from inside chassis 102, and/or move air across one or more heatsinks (not explicitly shown) internal to chassis 102 to cool one or more information handling resources of information handling system 100. The structure and function of blower module assemblies 104 may be described in greater detail below with respect to FIGS. 2A-2E.

Although information handling system 100 is depicted as including two blower module assemblies 104, information handling system 100 may include any number of blower module assemblies 104. In addition, although a particular configuration of blower module assemblies 104 is depicted, blower module assemblies 104 may be configured in any suitable manner.

FIGS. 2A-2E illustrate various schematic views of an example blower module assembly 104, in accordance with the present disclosure. In particular, FIG. 2A illustrates an exploded schematic view of selected components of example blower module assembly 104, FIG. 2B illustrates a perspective assembled view depicting an exhaust portion of example blower module assembly 104, FIG. 2C illustrates a perspective assembled view depicting an intake portion of example blower module assembly 104, FIG. 2D illustrates a cutaway perspective assembled view depicted the intake portion of example blower module assembly 104, and FIG. 2E illustrates an elevation view of the intake portion of example blower module assembly 104.

As shown in FIGS. 2A-2E, blower module assembly 104 may include housing member 202, housing member 204, discharge assembly 206, connector mounting bracket 208, connector 210, blowers 212, septum 214, and airflow guides 216.

Housing member 202 and housing member 204 may be configured to mechanically couple to each other (e.g., via one or more flanges, one or more fasteners, and/or one or more openings configured to receive fasteners) to form a housing for various components of blower module assembly 104. One or more of housing member 202 and housing member 204 may be constructed from steel, aluminum, plastic, and/or any other suitable material. Although the term "housing" is used to describe the combination of housing member 202 and housing member 204, such combination may also be referred to as an enclosure and/or container. Housing member 202 and/or housing member 204 may comprise one or more flanges and/or one or more openings configured to receive a fastener (e.g., screw, nut, and/or bolt) for mechanically coupling and/or mounting another component of blower module assembly 104 to such housing member 202 and/or housing member 204.

Discharge assembly 206 may be configured to mechanically couple to housing member 202 and/or housing member 204 (e.g., via one or more flanges, one or more fasteners, and/or one or more openings configured to receive fasteners), and may include an air vent, fins, and/or other openings or structures configured to guide or direct air discharged by blower module assembly 104 (e.g., guide discharged air externally to chassis 102). Discharge assembly 206 may be constructed from steel, aluminum, plastic, and/or any other suitable material.

Connector mounting bracket 208 may be configured to mechanically couple to housing member 202 and/or housing member 204 (e.g., via one or more flanges, one or more fasteners, and/or one or more openings configured to receive fasteners), and may further be configured to mechanically support connector 210. Connector mounting bracket 208 may be constructed from steel, aluminum, plastic, and/or any other suitable material. In some embodiments, connector mounting bracket 208 may have one or more support members extending from housing member 202 and/or housing member 204 to support connector 210 at a substantial distance from housing member 202 and/or housing member 204 (e.g., arcuate member has a first end coupled to the housing and a second end coupled to connector 210 such that connector 210 is displaced from the housing in a direction substantially the same as or opposite of the exhaust airflow). In such embodiments, such one or more support members may be of an arcuate shape. By supporting connector 210 at a substantial distance from housing member 202 and/or housing member 204, connector mounting bracket 208 may allow for electrical coupling of blowers 212 and/or other components of blower module assembly 104 via connector 210, while reducing the drag, airflow impedance, and/or airflow performance loss caused by connector 210 and/or connector mounting bracket 208 on intake air flow into blower module assembly 104.

Connector 210 may be configured to mechanically couple to connector mounting bracket (e.g., via one or more flanges, one or more fasteners, one or more openings configured to receive fasteners, and/or an adhesive) and may be further configured to electrically coupled to a corresponding slot, connector, and/or electrical bus internal to chassis 102 such that electrical energy may be conducted via connector 210 to blowers 212 and/or other components of blower module assembly 104. Accordingly, connector 210 may also be electrically coupled to blowers 212 and/or other components of blower module assembly 104, and one or more electrically conductive conduits (e.g., wires, traces, etc.) may be coupled between connector 210 and blowers 212 and/or other components of blower module assembly 104. In some embodiments, such electrically conductive conduits may be disposed internal to support members of connector mounting bracket 208 and/or externally along support members of connector mounting bracket 208. In some embodiments, connector 210 and/or its corresponding slot, connector, and/or electrical bus internal to chassis 102 may also include a predefined form factor. Specific properties of connector 210 such as number of connections (or pins) and dimensions may vary depending on the manufacturer and/or an industry standard.

In some embodiments, a blower module assembly 104 may be adapted to removably couple both mechanically and electronically to chassis 102 via an appropriate bay of the chassis (e.g., by sliding the blower module assembly 104 in or out of the bay). In such embodiments, a blower module assembly 104 may include a handle 218 and/or other mechanical components to facilitate insertion and removal of a blower module assembly 104 into or from chassis 102. For example, chassis 102 and blower module assembly 104 may include appropriate rails, guides, and/or other mechanical features, such that a person (e.g., user, administrator, technician, etc.) may apply a force to cause the blower module assembly 104 to glide into an engaged position whereby connector 210 couples to a corresponding electrical component within chassis 102 and/or apply a force to cause the blower module assembly 104 to glide out of its corresponding bay within chassis 102.

Each blower 212 may be configured to mechanically couple to housing member 202 and/or housing member 204 (e.g., via one or more flanges, one or more fasteners, and/or one or more openings configured to receive fasteners) such that in operation, the blower 212 resides substantially internal to the housing created by housing member 202 and housing member 204. Each blower 212 may comprise any suitable mechanical system, device, or apparatus for moving air or other gases via the use of rotating impellers (e.g., a centrifugal fan), thus radially accelerating air received at its intake 213 and changing the direction (typically by 90°) of the airflow.

Septum 214 may be configured to mechanically couple to housing member 202, housing member 204, and/or one or more of blowers 212 (e.g., via one or more flanges, one or more fasteners, and/or one or more openings configured to receive fasteners) and may comprise a plate configured to, in concert with a blower 212 and airflow guide 216, define a plenum from which intake 213 of the blower 212 may draw air. In some embodiments, a portion of septum 214 may have an arcuate shape similar to that of an adjacent blower 212. For example, in many embodiments, a blower 212 may have the shape of a circular cylinder, in which case a portion of septum 214 may have a circular shape in order to match the profile of a portion of the blower. Such curved profile of septum 214 may increase airflow through blower module assembly 104 as compared to embodiments in which a completely rectangular geometry is employed in place of septum 214. Septum 214 may be constructed from steel, aluminum, plastic, and/or any other suitable material. In some embodiments, septum 214 may be considered part of the housing formed by housing member 202 and housing member 204.

Each airflow guide 216 may be mechanically coupled between a corresponding blower 212 and the housing of blower module assembly 104 (e.g., one of septum 214 and housing member 204). An airflow guide 216 may be constructed from foam and/or another material known in the art to dampen acoustical noise and/or vibration. As shown in FIGS. 2A and 2D, an airflow guide may be shaped to have a solid region 222 and a plenum region 224 such that the border between the solid region and the plenum region is defined by a portion of an arcuate cylinder (e.g., a parabolic cylinder, catenary cylinder, circular cylinder, elliptical cylinder, etc.). Solid region 222 may be substantially completely resistive to air flow (e.g., include foam and/or another material from which the airflow guide 216 is constructed), while plenum region 224 may be substantially free of matter resistive to air flow. Accordingly, airflow guide 216 may also seal plenum 222 from air leaks on the exhaust side of blower module assembly 104.

When blower module assembly 104 is assembled and in operation, the intake 213 of each blower 212 may be adjacent to a plenum 220, wherein the shape of each plenum is defined by a face of the blower 212, the arcuate cylinder defined by an airflow guide 216, and a portion of the housing (e.g., one of septum 214 and housing member 204). Accordingly, a blower 212 may move air from an adjacent plenum 220, through intake 213, and expel such air through discharge assembly 206, thus exhausting air from chassis 102. Although an arrangement is depicted in FIGS. 1-2E in which blower module assemblies 104 are configured to exhaust air from chassis 102, in other embodiments blower module assemblies 104 may be arranged so as to move air from the outside of chassis 102 to the inside of chassis 102.

The blower module assembly disclosed herein, and/or similar devices, systems, or apparatuses, may have one or more advantages compared to traditional fans and blowers. For example, by employing airflow guide 216 with its arcuate cylinder shape, a plenum for blower intake is defined that, when compared to traditional blower and fans, may more effectively direct airflow to a blower, reduce recirculation of exhausted air, reduce acoustical noise, absorb mechanical vibration, and/or provide air seals at desired portions of a blower module assembly.

Although the present disclosure has been described in detail, it should be understood that various changes, substitutions, and alterations can be made hereto without departing from the spirit and the scope of the disclosure as defined by the appended claims.

What is claimed is:
1. A blower module assembly comprising:
a housing;
a blower mechanically coupled to the housing, the blower having an intake and an exhaust, the blower configured to move air flowing in an intake direction from the intake to flow in an exhaust direction out of the exhaust; and an airflow guide mechanically coupled between the housing and the blower, the airflow guide having a solid region defined at least in part by a portion of an arcuate cylinder, wherein the airflow guide is displaced from the blower along an axis defined by the intake direction;

wherein the housing, the blower, and the airflow guide are arranged such that a plenum is defined by surfaces of the housing, the blower, and the solid region of the airflow guide, the plenum being adjacent to the intake.

2. The blower module assembly of claim 1, the portion of the arcuate cylinder comprising one of a portion of a parabolic cylinder, a portion of a catenary cylinder, a portion of a circular cylinder, and a portion of an elliptical cylinder.

3. The blower module assembly of claim 1, further comprising:
   a connector mounting bracket mechanically coupled to the housing; and
   a connector mechanically coupled to the connector mounting bracket and electrically coupled to the blower.

4. The blower module assembly of claim 3, the connector mounting bracket having at least one member comprising:
   a first end mechanically coupled to the housing; and
   a second end mechanically coupled to the connector such that the connector is displaced from the housing substantially along an axis defined by the exhaust direction.

5. The blower module assembly of claim 4, the at least one member having an arcuate shape.

6. The blower module assembly of claim 1, the housing configured to slidably engage with a chassis.

7. The blower module assembly of claim 6, the chassis comprising an information handling system chassis.

8. An information handling system comprising:
   a chassis; and
   a blower module assembly configured to be mechanically coupled to the chassis, the blower module assembly comprising:
   a housing;
   a blower mechanically coupled to the housing, the blower having an intake and an exhaust, the blower configured to move air flowing in an intake direction from the intake to flow in an exhaust direction out of the exhaust; and
   an airflow guide mechanically coupled between the housing and the blower, the airflow guide having a solid region defined at least in part by a portion of an arcuate cylinder, wherein the airflow guide is displaced from the blower along an axis defined by the intake direction;
   wherein the housing, the blower, and the airflow guide are arranged such that a plenum is defined by surfaces of the housing, the blower, and the solid region of the airflow guide, the plenum being adjacent to the intake.

9. The information handling system of claim 8, the portion of the arcuate cylinder comprising one of a portion of a parabolic cylinder, a portion of a catenary cylinder, a portion of a circular cylinder, and a portion of an elliptical cylinder.

10. The information handling system of claim 8, the blower module assembly further comprising:
    a connector mounting bracket mechanically coupled to the housing; and
    a connector mechanically coupled to the connector mounting bracket and electrically coupled to the blower.

11. The information handling system of claim 10, the connector mounting bracket having at least one member comprising:
    a first end mechanically coupled to the housing; and
    a second end mechanically coupled to the connector such that the connector is displaced from the housing substantially along an axis defined by the exhaust direction.

12. The information handling system of claim 11, the at least one member having an arcuate shape.

13. The information handling system of claim 8, the housing configured to slidably engage with the chassis.

14. A method comprising:
    mechanically coupling a blower to a housing, the blower having an intake and an exhaust, the blower configured to move air flowing in an intake direction from the intake to flow in an exhaust direction out of the exhaust;
    mechanically coupling an airflow guide between the housing and the blower, the airflow guide having a solid region defined at least in part by a portion of an arcuate cylinder, wherein the airflow guide is displaced from the blower along an axis defined by the intake direction; and
    arranging the housing, the blower, and the airflow guide such that a plenum is defined by surfaces of the housing, the blower, and the solid region of the airflow guide, the plenum being adjacent to the intake.

15. The method of claim 14, the portion of the arcuate cylinder comprising one of a portion of a parabolic cylinder, a portion of a catenary cylinder, a portion of a circular cylinder, and a portion of an elliptical cylinder.

16. The method of claim 14, further comprising:
    mechanically coupling a connector mounting bracket to the housing;
    mechanically coupling a connector to the connector mounting bracket; and
    electrically coupling the connector to the blower.

17. The method of claim 16, wherein the connector mounting bracket comprises at least one member and mechanically coupling the connector to the connector mounting bracket comprises:
    mechanically coupling a first end of the at least one member to the housing; and
    mechanically coupling a second end of the at least one member to the connector such that the connector is displaced from the housing substantially along an axis defined by the exhaust direction.

18. The method of claim 17, the at least one member having an arcuate shape.

19. The method of claim 14, further comprising configuring the housing to slidably engage with a chassis.

20. The method of claim 19, the chassis comprising an information handling system chassis.

* * * * *